(12) United States Patent
Coats et al.

(10) Patent No.: US 11,605,974 B2
(45) Date of Patent: Mar. 14, 2023

(54) ON-LINE POWER MEASUREMENT (71) Applicant: ABB Schweiz AG, Baden (CH)

(72) Inventors: David Coats, Apex, NC (US); James Stoupis, Raleigh, NC (US); Arun K. Kadavelugu, Raleigh, NC (US); Bandeep Singh, Knightdale, NC (US)

(73) Assignee: ABB SCHWEIZ AG, Baden (CH)

( * ) Notice: Subject to any disclaimer, the term of this patent is extended or adjusted under 35 U.S.C. 154(b) by 613 days.

(21) Appl. No.: 16/263,424

(22) Filed: Jan. 31, 2019

(65) Prior Publication Data
US 2020/0251927 A1    Aug. 6, 2020

(51) Int. Cl.
*H02J 13/00*    (2006.01)
*G01R 15/14*    (2006.01)
*G01R 19/15*    (2006.01)

(52) U.S. Cl.
CPC .......... *H02J 13/0086* (2013.01); *G01R 15/14* (2013.01); *G01R 19/15* (2013.01)

(58) Field of Classification Search
CPC ...... G01R 15/14; G01R 15/142; G01R 15/16; G01R 19/15; G01R 19/2513; G01R 31/58; H02J 13/0086; H04B 3/46
See application file for complete search history.

(56) References Cited

U.S. PATENT DOCUMENTS

| 9,651,584 | B2 | 5/2017 | Gunn | |
| 2004/0160217 | A1* | 8/2004 | Birkle | H02J 50/12 323/211 |
| 2005/0275397 | A1* | 12/2005 | Lightbody | G01R 15/142 324/126 |
| 2006/0170432 | A1* | 8/2006 | Adolfsson | G01R 15/16 324/658 |
| 2015/0346240 | A1 | 12/2015 | Gunn | |
| 2016/0061862 | A1 | 3/2016 | Nulty | |
| 2017/0234908 | A1* | 8/2017 | Gravermann | G01R 15/16 324/126 |
| 2018/0143234 | A1 | 5/2018 | Saxby | |
| 2019/0140477 | A1* | 5/2019 | Yang | H02J 3/381 |

FOREIGN PATENT DOCUMENTS

| CN | 102 680 856 | A | 9/2012 |
| CN | 107 607 832 | A | 1/2018 |
| EP | 3671227 | A1 * | 6/2020 |
| KR | 2016 0069106 | A | 6/2016 |
| KR | 2018 0117257 | A | 10/2018 |

(Continued)

OTHER PUBLICATIONS

European Search Report for EP 20 15 4819 dated Jun. 16, 2020, 10 pages.

(Continued)

*Primary Examiner* — Son T Le
*Assistant Examiner* — Adam S Clarke
(74) *Attorney, Agent, or Firm* — Armstrong Teasdale LLP (57) ABSTRACT

Devices, systems, and methods for measurement of parameters of electric power transmission lines can improve electric power usage, while wireless circuitry can provide communication from field-located devices. Connection to draw electrical power from the transmission line can be distinct from connection to sense line parameters.

21 Claims, 4 Drawing Sheets (56) References Cited

FOREIGN PATENT DOCUMENTS

WO    WO-2005013650 A2 *  2/2005  ............... G01R 1/22
WO       2014088562 A1    6/2014

OTHER PUBLICATIONS

Cetinkaya et al., "Electric-Field Energy Harvesting in Wireless Networks", Technical Report of Wireless Networking Group, IEEE Wireless Communications, vol. 24, No. 2, Apr. 1, 2017, 7 pages.
Guo et al., "Energy Harvesting Devices for High Voltage Transmission line Monitoring", Power and Energy Society General Meeting, IEEE, Jul. 24, 2011, 8 pages.
Najafi et al., "Energy Harvesting from Overhead Transmission Line Magnetic Fields", IEEE Energy Conversion Congress and Exposition (ECCE), Sep. 23, 2018, 8 pages.
Zhao et al., "Energy Harvesting for Overhead Power Line Monitoring", 9th International Multi-Conference on Systems, Signals and Devices, IEEE, Mar. 20, 2012, 5 pages.
A. Kadavelugu et al.; "Auxiliary power supply for Solid State Transformers," 2012 IEEE Energy Conversion Congress and Exposition (ECCE), Raleigh, NC, 2012, pp. 1426-1432.

* cited by examiner

ON-LINE POWER MEASUREMENT

TECHNICAL FIELD

The present disclosure relates to the field of electric power transmission. More particularly, the present disclosure relates to monitoring overhead electric power transmission lines.

BACKGROUND

In monitoring electric power transmission lines, remote monitoring can be advantageous to assess operation along transmission lines that span remote areas. However, approaches to remote monitoring may face challenges related to the desire to minimize maintenance requirements in these remote locales. Moreover, the prevalence of transmission lines in such remote areas can incur considerable expense in facilitating monitoring operations. Conformable means of monitoring and communicating information regarding transmission line operation can assist in efficient operation and observability of related systems.

SUMMARY

According to an aspect of the present disclosure, an on-line measurement system for measurement and communication of transmission parameters of a transmission line may include a measurement platform adapted for connection with the transmission line for measurement of one or more transmission parameters. The measurement platform may include at least one sensor adapted for communication with the transmission line to sense one or more parameters of the transmission line. The measurement system may include a monitoring bank arranged in communication with the measurement platform to receive indications of the one or more parameters of the transmission line. The monitoring bank may include at least one processor and communication circuitry. The at least one processor may be adapted to execute instructions to communicate indications of the one or more parameters of the transmission line to users via the communication circuitry. The measurement system may include an energy management system adapted for connection with the transmission line for collecting and managing energy for operation of the on-line measurement system. The energy management system may include a capacitive voltage divider bank having a plurality of serially connected capacitors. One capacitor of the plurality may be adapted for communication with the transmission line to receive a transmission line voltage. Another capacitor of the plurality may be connected to provide an output voltage lower than the transmission line voltage.

In some embodiments, the measurement platform may be adapted for connection with the transmission line at a first connection and the energy management system may be adapted for connection with the transmission line at a second connection. In some embodiments, the measurement system may further comprise a power management system for regulating electric power to at least one of the measurement platform and/or the monitoring bank. The power management system may include a power supply connected with at least one of the measurement platform and the monitoring bank.

In some embodiments, the power management system may include a power converter adapted to covert low voltage AC received from the another capacitor into low voltage DC for communication to the power supply. The power management system may include a power storage device. The measurement platform may include a processor adapted to convert and isolate measurement data from the at least one sensor.

In some embodiments, the at least one sensor may include a configurable front end measurement interface adapted to sense at least one voltage and/or current level of the transmission line. The at least one sensor may include two sensors each adapted to sense parameters of a different phase of voltage of the transmission line. The at least one sensor may include at least one of a resistive divider and a current transformer.

In some embodiments, the communications circuitry of the monitoring bank may include wireless communications circuitry for wirelessly communicating parameters of the transmission line to other users. The other users may include external users. The wireless communications circuitry may be adapted to provide a wireless access point.

In some embodiments, the energy management system may include capacitive voltage divider protection circuitry through which the one capacitor may be in communication with the transmission line. The capacitive voltage divider protection circuitry may include at least one of in-rush current limiting protection circuitry and surge arrestor circuitry. An auxiliary power port may be arranged in communication with the energy management system to provide electrical power to auxiliary devices.

According to another aspect of the present disclosure, a measurement device for measurement and communication of transmission parameters of a transmission line may include a measurement interface mounted on and/or connected with the transmission line for measurement of one or more transmission parameters. The measurement interface may include at least one sensor in communication with the transmission line to sense one or more parameters of the transmission line. The measuring device may include monitoring bank arranged in communication with the measurement interface to receive indications of the one or more parameters of the transmission line. The monitoring bank may include at least one processor and communication circuitry. The at least one processor may be adapted to execute instructions to communicate indications of the one or more parameters of the transmission line to users via the communication circuitry. The measurement device may include an energy management system connected with the transmission line for collecting and managing energy for operation of the on-line measurement system. The energy management system may include a capacitive voltage divider bank having a plurality of serially connected capacitors. One capacitor of the plurality in may be arranged in communication with the transmission line to receive a transmission line voltage. Another capacitor may be connected to output an output voltage lower than the transmission line voltage.

In some embodiments, the measurement interface may be connected with the transmission line at a first connection and the energy management system is connected with the transmission line at a second connection. In some embodiments, the measurement device may include a power management system for regulating electric power to at least one of the measurement interface and the monitoring bank. The power management system may include a power supply connected with the at least one of the measurement interface and the monitoring bank. The power management system may include a power converter adapted to covert low voltage AC received from the another capacitor into low voltage DC for communication to the power supply. The power management system may include a power storage device.

In some embodiments, the measurement interface may include a processor adapted to convert and isolate measurement data from the at least one sensor. The at least one sensor may include two sensors each adapted to sense parameters of a different phase of voltage of the transmission line. The at least one sensor may include a configurable front end measurement interface adapted to sense at least one voltage and/or current level of the transmission line.

In some embodiments, the communications circuitry of the monitoring bank may include wireless communications circuitry for wirelessly communicating parameters of the transmission line to other users. The other users may be external users. The wireless communications circuitry may be adapted to provide a wireless access point.

In some embodiments, the energy management system may include capacitive voltage divider protection circuitry through which the one capacitor may be in communication with the transmission line. The capacitive voltage divider protection circuitry may include at least one of in-rush current limiting protection circuitry and surge arrestor circuitry. An auxiliary power port may be arranged in communication with the energy management system to provide electrical power to auxiliary devices.

These and other features of the present disclosure will become more apparent from the following description of the illustrative embodiments.

BRIEF DESCRIPTION OF THE DRAWINGS

The concepts described in the present disclosure are illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. The detailed description particularly refers to the accompanying figures in which.

DETAILED DESCRIPTION OF THE DRAWINGS

While the concepts of the present disclosure are susceptible to various modifications and alternative forms, specific embodiments thereof have been shown by way of example in the drawings and will herein be described in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

Electrical power transmission can include distribution of electrical power over one or more electrical networks. Such networks can include interconnected transmission lines spanning large distances to provide electrical power from generation sources to users (loads). Grid performance can benefit from monitoring of the electrical power transmitted through the transmission lines.

Figure 1:
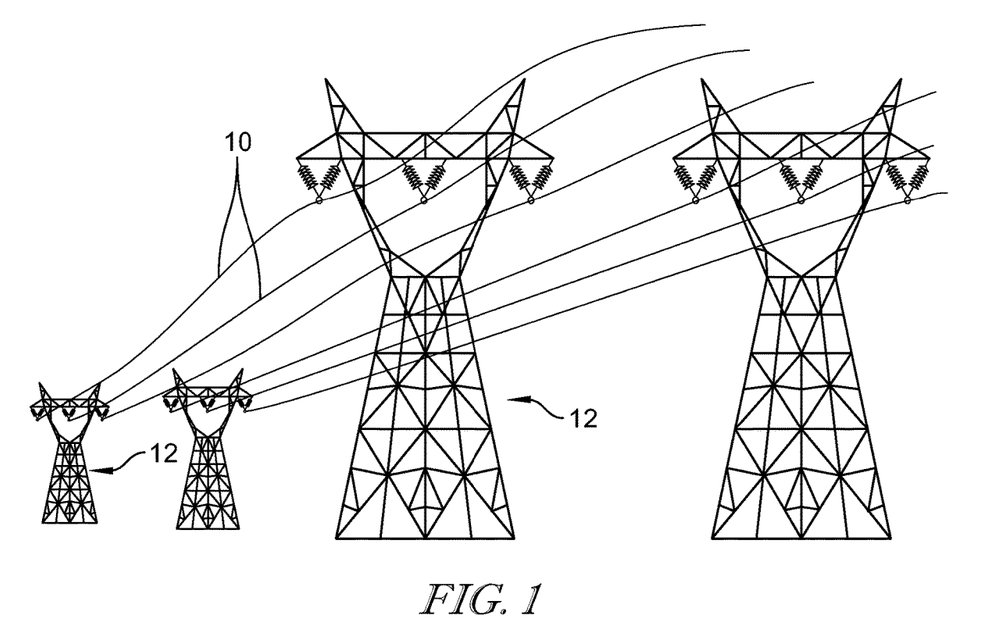
FIG. 1 is a perspective view of electric power transmission lines for communicating electric power showing that the transmission lines are supported above the ground by towers.

A number of transmission lines 10 is shown in FIG. 1 including overhead power transmission lines suspended through the air by transmission line towers or posts 12. In the illustrative embodiment, the transmission lines 10 include alternating current (AC) lines having 10-20 kV range, although in some embodiments, transmission lines 10 may carry any suitable range and manner of electrical power, including direct current (DC), and including voltages between 10 V to 20,000 kV. Field measurement of the transmission lines 10 can be used to improve grid functionality and/or performance.

Figure 2:
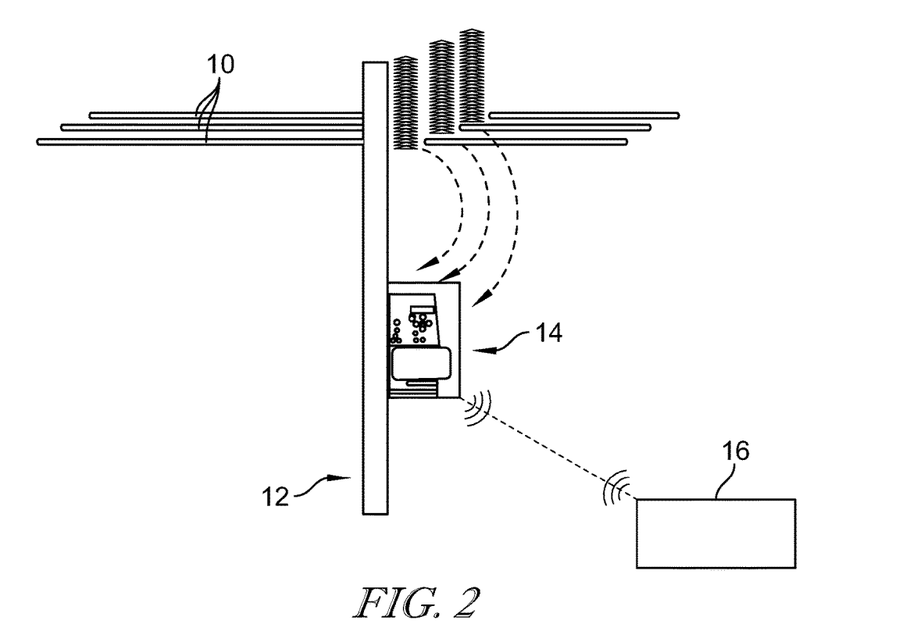
FIG. 2 is diagrammatic view of the transmission lines of FIG. 1 having a measurement apparatus mounted thereon for autonomous measurement of transmission parameters of the transmission lines for wireless communication to other users, and showing that the measurement apparatus is arranged on the transmission lines including a housing mounted on the upper end of the tower.

As shown in FIG. 2, a measurement apparatus 14 is connected with the transmission lines 10 to sense parameters of the transmission lines 10. The measurement apparatus 14 is illustratively arranged on the transmission line by connection with the transmission lines 10 themselves and mounting on the tower 12. In some embodiments, the measurement apparatus 14 may be supported in the field in any suitable manner for communication with the transmission lines 10.

In the illustrative embodiment, the measurement apparatus 14 is arranged in communication with other users 16. Such other users can include centralized control systems and/or supervisory control and data acquisition (SCADA) systems. As discussed in additional detail herein, the measurement apparatus 14 can be arranged for wireless communication (e.g., Wifi, LPWAN, cellular, 3G, 4G, 5G, or any other suitable communication) with the other users 16. The measurement apparatus 14 can communicate an indication of transmission line parameters to the other users 16 to promote improvements in grid control and monitoring.

Figure 3:
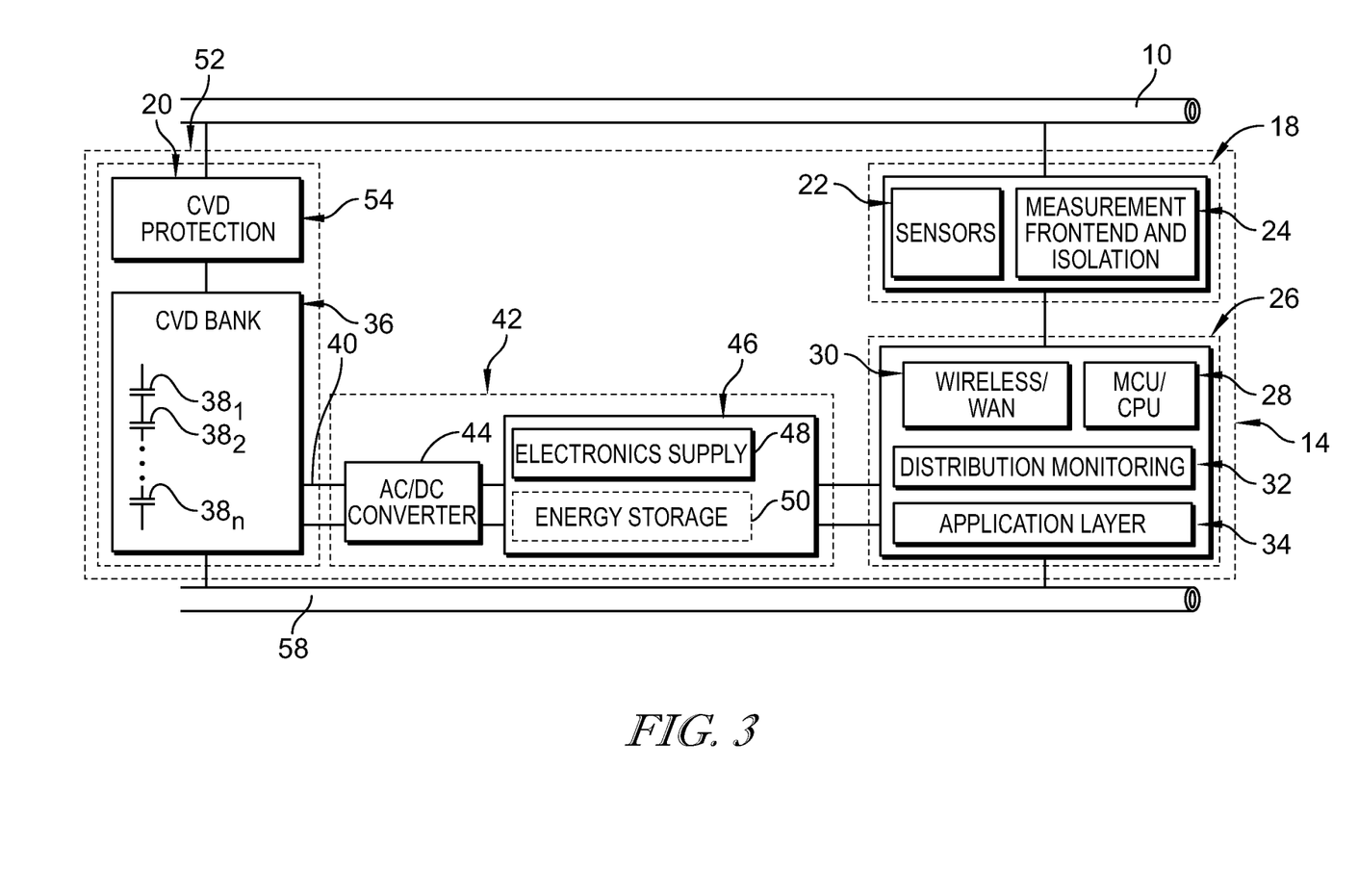
FIG. 3 is diagrammatic view of the measurement apparatus of FIG. 2, showing that the apparatus includes a measurement platform connected with a transmission line to sense line parameters and a device energy management system connected with the transmission line to receive and step-down electric power for apparatus operation, and showing that the apparatus includes a monitor for conducting communication operations, and a power management system for receiving stepped-down power from the device energy management system for use in the apparatus.

As shown in FIG. 3, a diagram of the measurement apparatus 14 illustratively includes a measurement platform 18 and a device-level energy management system 20. The measurement platform 18 is arranged in communication with the subject transmission line 10 in the field for autonomous measurement of parameters of the transmission line 10 while the transmission line 10 is energized, partially energized, and/or faulted. The measurement platform 18 includes one or more sensors 22 arranged to sense parameters of the transmission line 10. Each sensor 22 is arranged to sense one or more of parameters, such as electrical (e.g., voltage, current), mechanical (e.g., strain, deflection), thermal (e.g., temperature), chemical (e.g., composition) parameters, of the transmission line 10 and/or any other directly sensed parameter; although indirect parameters may be determined from the direct parameters, for example, but without limitation, voltage and/or current root mean square (RMS) over time interval, digital and/or analog filtered voltage, current waveforms, average voltage and/or current RMS quantities, angle and/or time difference between sensed voltage and current values, voltage and/or current harmonics, total harmonic distortion from voltage and/or current measured values, and/or any other suitable parameters. The measurement platform 18 illustratively includes front-end measurement and isolation circuitry 24 for conducting suitable conversion, conditioning, and/or related processing to the raw signals sensed from the transmission line 10, as discussed in additional detail below.

The measurement apparatus 14 illustratively includes a monitor 26 in communication with the measurement platform 18 to receive indication of parameters of the transmission line 10 and to communicate indication of such parameters to other users 16. The monitor 26 includes a processor 28 for executing stored instructions and communications circuitry 30 for communicating an indication of parameters of the transmission line 10 to other users 16 according to guidance by the processor 28.

The communications circuitry 30 is illustratively embodied as wireless communications circuitry for sending and/or receiving wireless communication with other users 16. The communications circuitry 30 is illustratively embodied to include a secure onboard wireless hotspot (access point) generating circuit for communicating via wide area network (WAN), which may include low power WAN. In some embodiments, communications circuitry 30 may communicate via any suitable manner of wireless communications, for example but without limitation, LAN, Wi-fi, Bluetooth, and/or cellular (3G, 4G, 5G), and/or may include a connectivity package for accessing a separate wireless network for low power consumption. The communications circuitry 30 is illustratively configured for conducting communications via a number of communication protocols such as TCP/IP, Modbus TCP/IP, DNP 3.0, and/or IEC61850 standards. The processor 28 is illustratively embodied as one or more microcontroller units (MCUs) each having at least one central processing unit (CPUs). But in some embodiments, the processor 28 may be embodied to include one or more microprocessor units, one or more integrated circuits, and/or any other suitable control device. In some embodiments, the monitor 26 may include one or more secondary receiving units, controllers (such capacitor back controllers), and/or connections to an additional wide area monitoring service, Supervisory Control and Data Acquisition (SCADA), and/or other devices for receiving monitored voltage, current, and other sensor data.

Referring still to FIG. 3, the monitor 26 includes distribution monitoring circuitry 32 and an application layer module 34. The distribution monitoring circuitry 32 includes circuitry for monitoring, managing, and optimizing the power consumption of the measurement apparatus 14. The distribution monitoring circuitry 32 includes circuitry for self-calibration of the measurement apparatus 14 and circuitry for analyzing and locally processed data and providing alerts to connected receivers based on configurable thresholds.

The application layer module 34 is illustratively embodied as stored instructions executable by the processor 28 to implement local applications, control intervals for transmitting data, and/or for performing power consumption optimization, self-calibration, and/or local data processing. The application layer module 34 may include sensor health and/or diagnostic applications to provide condition based and/or preventative indicators, although in some embodiments, such applications may be executed remotely. In some embodiments, the monitor 26 may include connections to one or more supplementary sensors, for example but without limitation, electric or magnetic field sensors, thermocouples or other temperature sensors, accelerometers, gyroscopes, and/or inclinometers, for sensing auxiliary parameters of the transmission line 10 and/or measurement apparatus 14. Power for operating the 18 and/or the 26 may be provided via the device energy management system 20.

Referring still to FIG. 3, the device energy management system 20 is connected with the transmission line 10 to receive electric power. The device energy management system 20 includes a capacitive voltage divider bank 36 for stepping down voltage received from the transmission line 10 to a lower voltage for use in the measuring apparatus 14. The voltage divider bank 36 illustratively includes a number of capacitors $38_{1-n}$ connected in series to step down voltage received from the transmission line 10.

A primary capacitor $38_1$ is in communication with the transmission line 10 to receive the transmission line voltage, which is the full voltage or very nearly the full voltage transmitted by the transmission line 10. The series of capacitor 38 reduces the voltage serially approach the higher numbers capacitors (e.g., $38_n$). An output capacitor $38_n$ provides an output voltage $V_o$ for use. In the illustrative embodiment, the output capacitor $38_n$ is connected with the transmission line 10 through the other capacitors of the voltage divider bank 36 to receive an intermediary voltage and to provide the output voltage $V_o$. The output capacitor $38_n$ is embodied as a final or lowest capacitor, but in some embodiments may be any of the capacitors 38 other than the primary capacitor $38_1$. The number and ratings (size) of each of the capacitors 38 can be optimized according power demands of the measurement apparatus 14, namely, the power demands of the monitor 26 and/or measurement platform 18. Optimization of the capacitors can include selection to minimize reactive loading on the transmission line 10. The device energy management system 20 includes an output connection 40 in communication with the output capacitor $38_n$ for providing the output voltage $V_o$ for use.

Figure 4A:
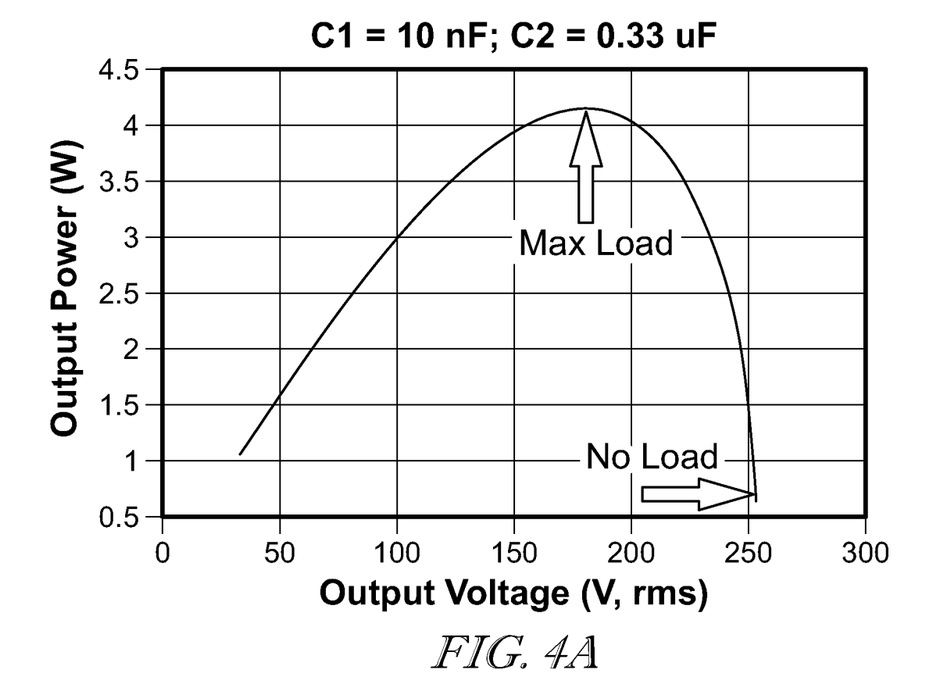
FIGS. 4A and 4B are exemplary diagrams of the output power profile across an output capacitor of a capacitor voltage divider of the device energy management system.
Figure 4B:
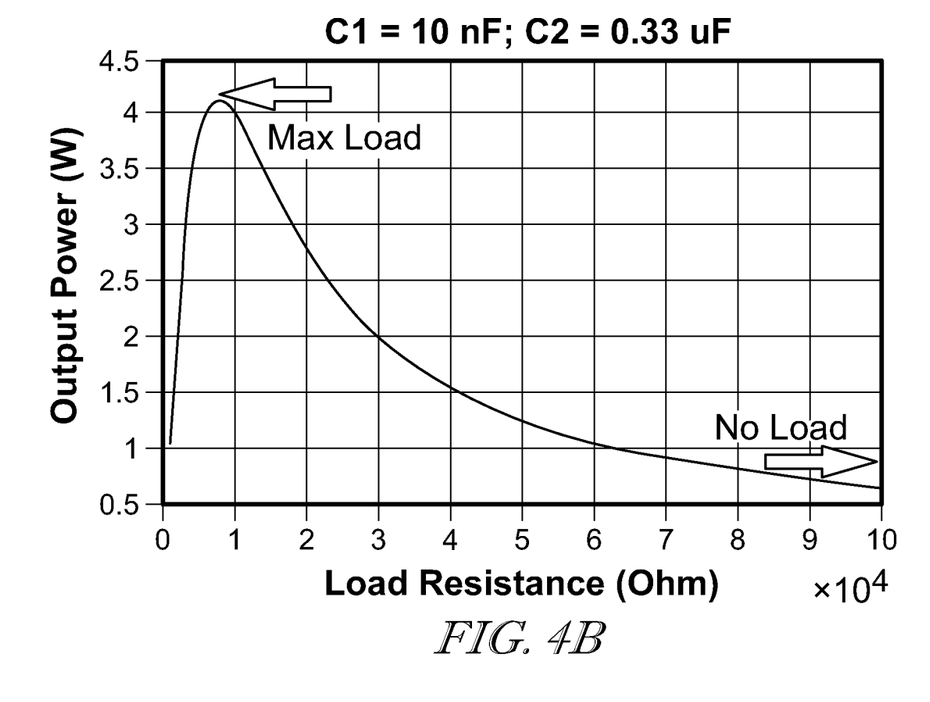

FIGS. 4A and 4B illustrate the output power profile (across output capacitor $38_n$) of the capacitor voltage divider 36 with varying load. It is shown that the power of the output connection 40 (essentially the output of the output capacitor $38_n$) that can be provided by the voltage divider 36 is limited to a maximum value (e.g., approximately 4.2 W for the particular embodiment). Also, there is a considerable voltage variation with real power loading across the output capacitor $38_n$. Therefore, the capacitors 38 sizing should be appropriately based on the worst-case loading scenario. Choosing larger capacitors 38 can provide larger output power but may increase the reactive power loading on the transmission line 10, in addition to their increased size and cost.

Returning to FIG. 3, the measurement apparatus 14 includes a power management system 42 for governing power use within the apparatus 14. The power management system 42 illustratively includes a power converter 44 and a power management module 46. The power management system 42 is connected with the output connection 40 to receive output from the output capacitor $38_n$. The power converter 44 is embodied as an AC/DC converter receiving AC at the output voltage $V_o$ for conversion to DC.

In the illustrative embodiment, the voltage output $V_o$ can fluctuate considerably over time. Accordingly, the power converter 44 is embodied as an isolated wide input voltage range converter capable of accepting a wide range of input voltages, for example, from about 5 to about 240 VAC and to provide about 3 to about 5 VDC for use in the measurement apparatus 14, although in some embodiments, any suitable voltage may be provided for use in the measurement apparatus 14, including unconverted power from the output capacitor $38_n$ without power converter 44. For example, in some embodiments, the converter 44 is adapted to accept wide fluctuations in input voltage from the capacitive voltage divider beyond typical brownout voltage limits (i.e operating with 50% nominal voltage to 200%). While wide input power supplies are available for many consumer electronics, the input range for the converter 44 may be wider still, and the converter 44 can be adapted to harvesting energy in adverse voltage conditions at the cost of power converter efficiency. The power converter 44 is illustratively connected with the power management module 46 to provide DC power for data acquisition and control electronics.

The power management module 46 includes electronic supply circuitry 48 for regulating electric power to the monitor 26 and/or measurement platform 18. The electronic supply circuitry 48 includes circuitry components in communication with the monitor 26 and/or measurement platform 18 to provide operative electric power. An optional energy storage device 50 can be included to maintain power during interruptions, for example, to maintain time synchronizations, timestamps, and/or similar features. The energy storage device 50 is embodied as a super capacitor having high-reliability and rechargability, but in some embodiments, may include any suitable power storage device. The power management module 46 is connected with the monitor 26 and/or measurement platform 18 to provide electric power for their operations.

The measurement apparatus 14 illustrative includes a housing 52 within which the measurement platform 18, the monitor 26, the energy management system 20, and/or the power management system 42 are housed. The device energy management system 20 can optionally include protection circuitry 54 arranged serially between the capacitive voltage divider 36 and the transmission line 10. The protection circuitry 54 can include circuitry for in-rush current limiting protection, arresters, and/or lighting/impulse limiting circuitry, output protection circuitry, and/or current and/or voltage limiting circuitry to provide safety features for operation. In some embodiments, impulse protection for the capacitive voltage divider circuitry may be arranged either internal to the sensing device or placed as one or more separate external devices, such as but not limited to, a surge arrester or set of upstream and downstream external surge arresting, cutout, and/or reclosing devices. In some embodiments, the measuring apparatus 14 may be connected with ground or neutral line 58.

Figure 5:
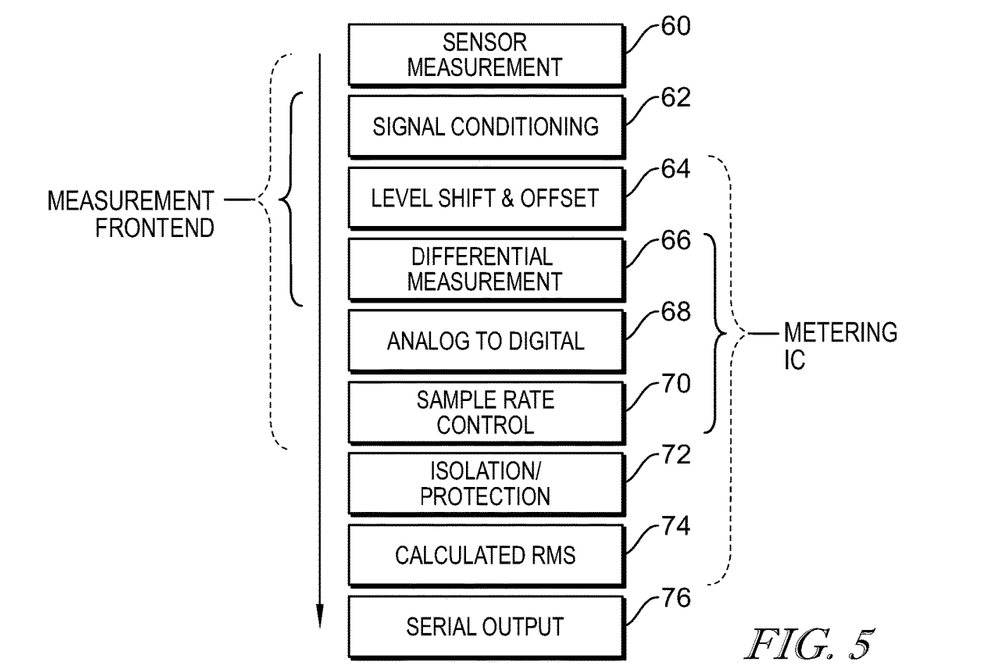
FIG. 5 is a process flow diagram showing operations of the measurement platform for receiving and processing raw sensor data for use.

Referring now to FIG. 5, a pictorial diagram of operations of the front-end measurement and isolation circuitry 24 is shown. The circuitry 24 illustratively provides primary functions including (i) processing of raw sensor output into usable forms, and (ii) metering, which may include differential, frontend, analog to digital conversion (ADC), and/or calculation of root mean squared (RMS) quantities. The processing of raw sensor data can include converting the raw sensor output from high voltage to low voltage and isolating the measurement to have a common ground with data acquisition circuitry.

The operations of the primary functions include receiving sensor measurement 60 from the sensors 22. Signal conditioning 62 is performed to adapt the raw sensor data into more useable form, which may include anti-aliasing and/or other means of filtering of measurement noise out of the system. The operations include level shift & offset processing 64, differential measurement 66, ADC 68, sample rate control 70, isolation and/or protection processing 72, and/or RMS calculation 74, as required. Processed sensor information is output 76 as serial output to the monitor 26 for transmission to other users 16. In some embodiments, these operations may be performed by different processor chips, and the specific operations performed by either processor may depend on the specific model of processor selected. In some embodiments, raw sensor data (e.g., voltage and current) may be reported as the output without built-in frontend processing.

Figure 6:
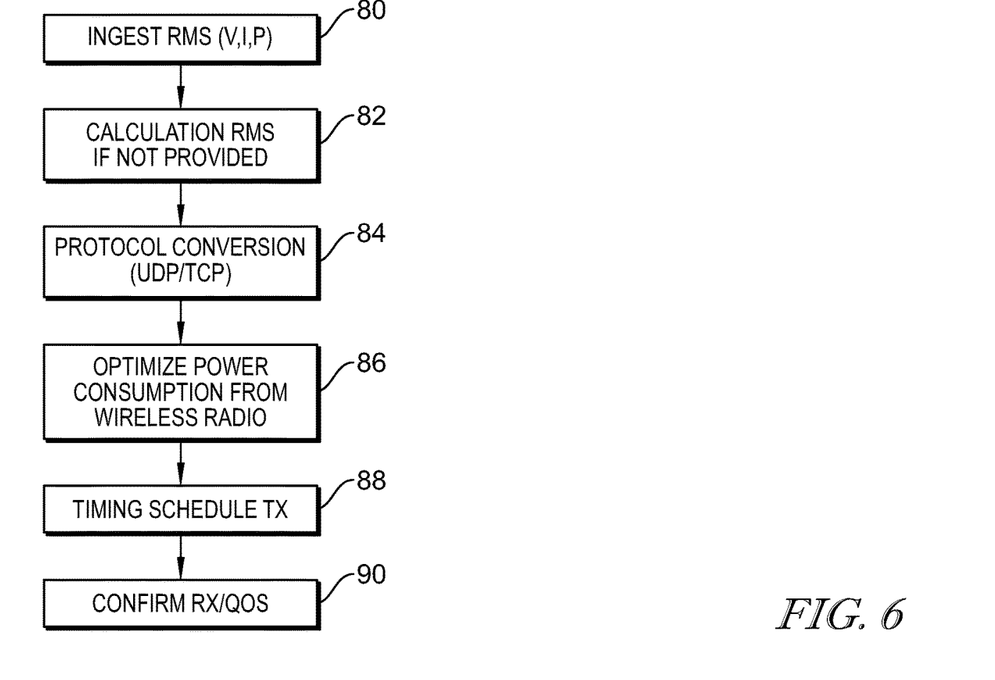
FIG. 6 is a process flow diagram showing operations of the monitor for configuring information received from the measurement platform for communication to other users.

Referring now to FIG. 6, a pictorial diagram of operations of the processor 28 is shown. The processor 28 is configured to receive raw and/or RMS measurements from the front-end measurement and isolation circuitry 24 as serial input 80, calculate any desired quantities not provided by metering 82, and then convert the information 84 into a protocol to be communicated by the communications circuitry 30. The processor 28 may be configured to perform power consumption optimization 86 for wireless communications, which may include timing the communication of wireless transmissions 88 to reduce power consumption. The monitor 26 may be arranged to receive a confirmation 90 from the recipient to maintain quality of service settings and retransmission logic as required if the message is not received. In some embodiments, the processor 28 may be configured to manage the charge of the optional energy storage device 50.

Overhead line sensors have traditionally been used for multiple typical applications including monitoring for faults and outages, feedback for supervisory control such as volt-VAR optimization, metering and usage details, and power quality monitoring and vary widely in capability. Some line sensors provide a single functionality such as fault indicators or directional fault indicators used simply to detect a predetermined condition of voltage or current over a given threshold. These may be "hot-stickable" onto a line or may be able to be placed on a line with a hot-stick or without interrupting service. Other "pole-top" overhead line sensors are mounted on the top of a power pole and may be either active or passive, providing an isolated measurement to a local capacitor bank controller or other device mounted on the power pole. Passive sensors provide analog measurements to another device and may have little or no processing capability embedded within the sensor unit itself, essentially requiring no power to perform measurements. Active sensors may have communication capabilities or local embedded processing for computations and logic passed to another controller. Wireless powerline sensors are active sensors requiring a power source to function and may have different levels of embedded processing. These wireless sensors often fall into categories of either battery powered, powered by photovoltaic cell, or line harvesting arrangements powered by current transformers (power primarily derived from line current) or capacitive voltage dividers (power primarily derived from line voltage). In typical applications of overhead pole-top sensors for providing measurements to a capacitor bank controller. a cable may run from each line sensor on each phase to the local controller. As wireless communication technology and embedded processors continue to reach new levels of performance, energy efficiency, and cost effective pricing, distributed communication concepts such as wide area monitoring (WAM), Internet of Things, Services, and People (IoTSP), and smart city or smart infrastructure provide new opportunities to integrate existing sensors into secure communication systems for better situational awareness, monitoring, and control. These applications, whether providing measurement information to a centralized controller or distributed nodes or devices, can dictate that additional distributed or collaborative sensors provide an operator with indication of line properties to inform operation control or monitoring. These measured line properties may be temperature (conductor or ambient), inclination or accelerometer (sag or wind/weather), or line voltage and current. In many existing utility monitoring devices such as overhead line sensors, copper, fiber, or other communication lines are run from the sensing device to a local controller with additional communication channels to a substation or other operation center. Other high voltage monitoring systems rely on power line carrier or wireless communication methods but often can still require a battery or connection to a low voltage power supply for operation of internal electronics. Utilities operation technology (OT) often focuses on maintaining long distances of overhead lines and power line connected devices with minimal direct oversight and over much larger intervals of time such as 20 to 30 or more years of continuous operation. Under these conditions, regularly changing out a battery to maintain an active sensing device is undesirable. The present disclosure includes devices, systems, methods for active measurement for pole-top wireless sensing with expansive communications options and applications. The devices, systems, methods may include harvesting energy from the high voltage line and may avoid reliability problems that arise from battery energy storage and other problems inherit to other methods of energy harvesting.

The present disclosure includes devices, systems, and methods for universal sensor interfaces for monitoring voltage, current, and/or other measurement inputs from energy transmission or distribution sensors such as overhead line measurement devices, and transmitting gathered data wirelessly to a separate receiver, base unit, or wide area monitoring systems. Wireless transmissions may be implemented either in real-time or as time-delayed packets of information using point-to-point wireless, mesh wireless, and/or cellular technology. Wireless communication of measured or sensing data from distribution or transmission lines can enable applications such as wide area monitoring of energy networks and local or distributed feedback to control and monitoring devices and multiple hierarchical layers such as capacitor bank controllers, remote terminal units, and distribution or power system-level energy management systems. Measurement units may consist of an energy harvesting element for providing power to electronics on an overhead or other transmission line, embedded sensing and data acquisition elements (such as voltage and current sensors), and wireless transmission and communication mediums with support for one or more protocols and standards. The energy harvesting system may include a modular capacitive voltage divider capable of providing power from applied line voltage and may minimize energy losses to the distribution or transmission network. The unit may be built into new sensing devices such as pole top sensors or provided as a retrofit device for existing sensors.

Devices, systems, and methods within the present disclosure may include an energy harvesting element for providing power to electronics on an overhead or other transmission line, embedded sensing and data acquisition elements (such as voltage and current sensors), and a wireless transmission and communication medium with support for multiple protocols and standards. For energy harvesting and conversion, a capacitive voltage divider used to power the active sensor elements may include a transmission/distribution line energy harvesting device including a bank of interchangeable capacitors typically separate and isolated from sensing systems with impulse and protection circuitry. This separation of power and measurement (sensing) may not require active compensation for the power drawn from the line by means of energy harvesting. The harvesting device may include capacitive divider protection circuitry such as in-rush current limiting protection, arresters or lightning/impulse limiting circuitry, output protection and current and voltage limiting is also required for safe operation. Impulse protection for capacitive voltage divider circuitry may be either internal to the sensing device or placed as one or more separate external device, such as but not limited to, a surge arrester or set of upstream and downstream external surge arresting, cutout, or reclosing devices. Devices, systems, and methods within the present disclosure may include an isolated wide input voltage range, alternating current (AC) to direct current (DC) converter and power supply for data acquisition and control electronics. Devices, systems, and methods within the present disclosure may include an optional high-reliability, energy storage element such as a supercapacitor may be used for maintaining power during short interruptions of generation from the energy harvesting source or maintaining time synchronization, timestamp, or similar features. Energy storage should be robust to multiple charge and recharge cycles over a typical OT lifespan expected by utilities.

Devices, systems, and methods within the present disclosure may include a line connected capacitor voltage divider used to provide necessary power to the electronic circuit of the proposed universal sensor interface. The line may correspond to a typical electrical distribution system, with voltage of approximately 10 kV (RMS/phase). The capacitor voltage divider may step down the voltage to meet the input voltage specification of the AC-DC converter. The primary capacitor may be exposed to almost the entire line voltage, except for a small fraction which is across the secondary capacitor. Depending on the expected loading by the electronic circuitry (which is fed by the AC-DC converter), optimally sized capacitors may be selected to minimize reactive loading on the line. The electronic sensing circuitry may be powered by fixed output voltage of the AC-DC converter. The output ac voltage profile (across secondary capacitor) of the capacitor voltage divider can indicate that power extracted by the divider circuit may be limited to a maximum value. Considerable voltage variation may exist with real power loading across the secondary capacitor. Accordingly, the capacitors sizing may be selected appropriately based on worst-case loading scenarios. Choosing larger capacitors can provide larger output power with increased reactive power loading on the line, in addition to increased size and cost.

The present disclosure includes architecture applying a minimally sized capacitive voltage divider for powering the electronic circuitry. The sensing of signals (line voltage, current, etc.) may be perform separately using a resistive divider or current transformer, etc. Separating the power harvest from the measurement can avoid complexity associated with using the same capacitor divider for sensing and powering the electronics, for example, where an accurate online estimation of the power drawn by the electronics is required for proper compensation. Thus, both energy harvesting circuit and sensing devices can be optimized for their purpose and/or for minimal costs.

Instead of a single lumped primary (high voltage) capacitor, illustrative embodiments apply a distributed capacitance with multiple low voltage capacitors. This can allow for flexible orientation within the sensor housing while achieving reduced overall size. The number of capacitors (for primary capacitance) can be appropriately altered for distribution systems with a different voltage rating, without incurring high cost or significant changes to the design. An optional resilient energy storage element such as a super capacitor may be used to maintain power for data acquisition or avoiding a power on reset cycle of an embedded processor and subsequent resetting of real-time clock or timestamp information. Typical energy harvesting capacitive voltage divider may be characterized by using a large sized capacitive voltage divider to provide auxiliary power for electronics of a solid state transformer (SST). Unlike embodiments within the present disclosure, the SST can inherently require a relatively large capacitor for harmonic filtering of power converters, where extracting the auxiliary power is its secondary function. However, using a minimally sized capacitive voltage divider for both powering the sensor and measuring with compensation for power used in the electronics can require accurate electronics power consumption estimate to maintain desired level of accuracy. Arrangements within the present disclosure may incur no compensation issue due to separate power and measurement elements. Some embodiments within the present disclose may use minimally sized capacitive divider with battery for both sensing the line voltage and for powering the electronic circuitry with separate intervals of charging and sensing.

Devices, systems, and methods within the present disclosure may sense various electrical, thermal or mechanical, or chemical properties from a high voltage line while this line is in an energized, partially energized, or possibly faulted state and communicate these properties to an external receiver. Voltage and current sensors may be applied, such as but not limited to, resistive voltage divider for voltage and a current transformer for current sensing. Additional types of sensing may employ measurement of electric and/or magnetic field (Rogowski coil or Hall Effect sensors). The measurement front end may consist of the necessary components to interface with all sensors, condition signals, level shift, filter, and convert the sensed value to an analog or digital value that can be taken as input by the microcontroller or other processing unit.

Devices, systems, and methods within the present disclosure may include a modular front end measurement interface configurable for multiple voltage and/or current levels along with any supplemental sensor measurement inputs, an analog to digital conversion integrated circuit or microcontroller/microprocessor device to convert and isolate measurement data gathered from the industrial sensors and configurable front end circuit. Data acquisition and control circuitry may compute various parameters on an embedded processor directly related to voltage and current on a high voltage line as well as any supplementary sensors. Examples of supplementary sensors may include electric or magnetic field sensors, thermocouples or other temperature sensors, accelerometers, gyroscope, inclinometer, or other sensors. Devices, systems, and methods within the present disclosure may include microcontrollers, microprocessors, or other control devices for processing the sensed measurement data. Illustrative embodiments may include power consumption monitoring input to the main processing unit reporting power consumed by the data acquisition and other monitoring circuitry for power management and optimization as well as self-calibration. This may also include charge management of a temporary energy storage element such as a supercapacitor. Illustrative embodiments may include wireless self-calibration arrangements that can receive an offset value from a separate high precision measurement device at regular intervals to reduce sensor drift and ease recalibration and certification efforts. Illustrative embodiments may include configurable thresholds or alerts to connected receivers based on locally processed data; sets of processes or embedded software for implementing local applications, controlling intervals for transmitting data, and power consumption optimization; sensor health or diagnostic applications to provide condition based or preventative indicators either processed locally or remotely.

Within the present disclosure, wireless transmission arrangements may include secure onboard wireless hotspot/access points generating circuit or connectivity package for accessing a separate wireless network optimized for low power consumption and can be configured for a number of conventional communication protocols such as TCP/IP, Modbus TCP/IP, and DNP 3.0 or IEC61850 standards. Illustrative embodiments may apply any suitable combination of secondary receiving unit, controller (such capacitor back controller), and/or connection to an additional wide area monitoring service, Supervisory Control and Data Acquisition (SCADA) or other device for receiving monitored voltage, current, and other sensor data.

Devices, systems, and methods within the present disclosure may sense various electrical, thermal or mechanical properties from a high voltage line while this line is in an energized, partially energized, or possibly faulted state and communicate these properties to an external receiver. Illustrative embodiments may perform sensing of these same electrical, thermal or mechanical, or chemical properties from a high voltage line while the line is not energized if a resilient energy storage medium is also provided within or external to the device and communicate these properties to an external receiver. Illustrative embodiments may perform measuring or sensing voltage and/or current from a high voltage line, and may communicate either raw values of these measurements or processed averaged/root mean square quantities to external devices. Illustrative embodiments may compute various parameters on an embedded processor directly related to voltage and current on a high voltage line, such as but not limited to, voltage root mean square over a given time interval, current root mean square over a given time interval, digital or analog filtered voltage and current waveforms, average voltage and current RMS quantities, an angle or time difference between sensed voltage and current values, and voltage or current harmonics or total harmonic distortion from voltage and current measured values. Some embodiments may include computation of various parameters on an embedded processor related to power on a high voltage line derived from voltage and current, such as but not limited to, power factor calculation from sensed voltage and current values, calculated apparent power from voltage and current measured values, calculated real from voltage and current measured values, and/or calculated or estimated reactive power from voltage and current measured values. Some embodiments may include computation of various parameters on an embedded processor related to power quality on a high voltage line derived from voltage and current such as under or over voltage condition and duration, off-nominal frequency, voltage or current harmonics or total harmonic distortion from voltage and current measured values, and/or other measureable quantities. Some embodiments may include computation of various parameters on an embedded processor related to indication of fault or other voltage, current or other sensor thresholds, such as but not limited to, voltage or current harmonics or total harmonic distortion from voltage and current measured values, feedback or logic detection of transient or other changes such as traveling wave from voltage and current measured values, and/or inferred conductor or other temperature calculation from voltage and current measured values. Embodiments including a modular font end may allow additional sensors to be added other than voltage and current and provides isolation of measurement and power subsystems. Such a modular front end can be designed for a wide range of inputs. Devices, systems, and methods within the present disclosure may include wireless communications that can enable additional applications, integration with existing utility systems, and wide area monitoring capability from connected sensors. Some embodiments may power other low power devices or electronics that may be placed on an overhead line. Examples of such other devices may include but are not limited to a camera or passive infrared monitor, a separate wireless gateway device, temporary electronics platform, or other potential uses.

Devices, systems, and methods within the present disclosure may avoid the need for expensive military grade and/or all-weather connectors from overhead line voltage, current sensors, and/or other power grid sensors to capacitor bank controllers. Instead a wireless module within the sensor can communicate with external controllers. However, before transmitting this wireless signal, the analog voltage measurement may first be converted to a digital value using an electronics board. The electronics board may include a measurement front end, microcontroller, and wireless chipset and should be reliably powered and designed to last for long installation periods desired by power utilities. Powering the sensor electronics can be done through energy harvesting and many different options are available for obtaining this power with different benefits and tradeoffs. Capacitive voltage dividers (CVD) within the present disclosure may provide primary power to the wireless sensor (in lieu of over remote power alternatives such as solar photovoltaic (PV), resistive voltage dividers, current transformer, thermoelectric generator, and/or battery operation). Use of PV and batteries as the primary power can leave an unfavorable impression on utility customers due to poor performance under impulse conditions. Photovoltaic cells depend on available sunlight and favorable weather conditions and may require a battery or super capacitor back-up with battery operation. Current transformers may require servicing lines that may not be fully energized much of the time. With minimal current in the primary side of the current transformer, the energy may not be sufficient to power the sensor interface. Devices, systems, and methods within the present disclosure may harvest energy from the high voltage of the measured line. A capacitive voltage divider may be used as a means of harvesting energy when there is voltage on the line, irrespective of the loading on the line. A separate resistor voltage divider may be used to sense the line voltage. Separate components for powering and sensing can improve reliability, and may also avoid the need for compensation circuitry for obtaining accurate data.

Within the present disclosure, separate circuitry for sensing and power can provide higher reliability of the measured data. Battery-less arrangements may increase reliability and longevity within an installed environment. Distribution of capacitance can provide flexible form factor. Simplicity in design can be provided for multiple voltage ratings, due to distributed primary (high voltage) capacitance. Illustrative embodiments may utilize commercially available (low voltage) capacitors, which can be cost-effective and can avoid the need for specialized high voltage capacitors. Communication circuitry can enable local and/or wide area monitoring applications. Additional sensor or set of sensors may be put in place to measure the line conductor temperature with placement on or around the conductor either at the same point of contact as the existing voltage or current measurement or a distance away from these sensing elements. Temperature increase sensed from the placed thermocouple or other device may be compared to current measurement within the embedded processing device for additional derived temperature parameters and/or fault indication.

In some embodiments, the transmission line voltage received by the primary capacitor may include nearly the entire voltage of the transmission line. In some embodiments, measurement and/or communication of transmission parameters may be autonomous.

Within the present disclosure, combination of one or more current, voltage, accelerometer, temperature, and/or gyroscope sensing devices may be used to employ line sag detection or qualification. This may entail detecting a change in the distance the overhead line cable is from the ground based on angles of inclination and the prerequisite sensing required for this determination. Embodiments of the sensor(s) within the present disclosure may be the possibility of using a single power harvesting element from one phase a pole-top sensor and satellite sensors wired or connected to the remaining multiple phases (for example within a three phase system). Each phase may have its own isolated measurement device or unit, powered by a single energy divider on one phase of the high voltage line. In some embodiments, change in the measurement devices may be necessary for higher voltages such as use of an additional capacitive voltage divider strictly used for voltage measurement and replacing the resistive voltage divider currently used or a different current transformer. Tamper-proof, IP rated connectors may be applied to provide an external auxiliary AC or DC power output to secondary connected devices. Power consumption of the auxiliary power output may be monitored by the main processing unit of the measurement platform and communicated remotely to prevent energy theft. A relay or other means of switching may be applied to disable connection to this auxiliary port. In some embodiments, a continuum series of sensor units may be applied where digital electronics parts (such as the main processing unit, wireless radio, and/or analog to digital frontend circuitry) can be replaced without replacing the complete unit. This may be implemented as an enclosed shelf or cabinet, attached plate, or external unit into which electronics cards or boards may be inserted or removed or by other means. Peer to peer firmware upgrade using some of the AMI (advanced metering infrastructure) techniques may be incorporated. Artificial intelligence based learning algorithms may be applied to provide preventive maintenance data to utility customers.

Within the present disclosure, a measurement apparatus may be arranged in communication with users, which may include centralized control systems and/or supervisory control and data acquisition (SCADA) systems. Sensors of the measurement apparatus may each measure a different phase of the transmission line. One or more analog-digital converters may convert the analog sensor signal to digital signal for each phase, and may communicate to send a wireless communication of the digital signal to a central receiver, as a centralized control system. This central receiver may be connected with a capacitor bank controller, such as the capacitor bank controllers mentioned herein, and may provide local communication/conversion. In some embodiments, the measurement apparatus may connect directly to a wireless router (such as ABB TropOS 2410 or 2420) for communication of sensed parameters to a SCADA system or data historian. The "centralized control system" refers to the capacitor bank controller, or other control device, collecting three phase measurements. In some embodiments, the centralized control system may be an ABB product (interoperable with other systems), such as the ABB COM600, MicroSCADA Pro SYS600, or other remote terminal units (RTU).

In some embodiments, the measurement apparatus may connect directly to a wireless router for communication of sensed parameters to a SCADA. The "centralized control system" refers to the capacitor bank controller, or other control device, collecting three phase measurements. In some embodiments, the centralized control system may be an ABB product (interoperable with other systems).

While certain illustrative embodiments have been described in detail in the figures and the foregoing description, such an illustration and description is to be considered as exemplary and not restrictive in character, it being understood that only illustrative embodiments have been shown and described and that all changes and modifications that come within the spirit of the disclosure are desired to be protected. There are a plurality of advantages of the present disclosure arising from the various features of the methods, systems, and articles described herein. It will be noted that alternative embodiments of the methods, systems, and articles of the present disclosure may not include all of the features described yet still benefit from at least some of the advantages of such features. Those of ordinary skill in the art may readily devise their own implementations of the methods, systems, and articles that incorporate one or more of the features of the present disclosure.

The invention claimed is:

1. An on-line measurement system for measurement and communication of transmission parameters of a transmission line, the system comprising:
a measurement platform adapted for connection with the transmission line for measurement of one or more transmission parameters, the measurement platform including at least one sensor adapted for communication with the transmission line to sense one or more parameters of the transmission line;
a monitoring bank arranged in communication with the measurement platform to receive indications of the one or more parameters of the transmission line, the monitoring bank including at least one processor and communication circuitry, the at least one processor adapted to execute instructions to communicate indications of the one or more parameters of the transmission line to users via the communication circuitry; and
an energy management system adapted for connection with the transmission line for collecting and managing energy for operation of the on-line measurement system, the energy management system including a capacitive voltage divider bank having a plurality of serially connected capacitors, one capacitor of the plurality adapted for communication with the transmission line to receive a transmission line voltage and another capacitor of the plurality connected to provide an output voltage lower than the transmission line voltage.

2. The on-line measurement system of claim 1, wherein the measurement platform is adapted for connection with the transmission line at a first connection and the energy management system is adapted for connection with the transmission line at a second connection.

3. The on-line measurement system of claim 1, further comprising a power management system for regulating electric power to at least one of the measurement platform and the monitoring bank, the power management system including a power supply connected with the at least one of the measurement platform and the monitoring bank.

4. The on-line measurement system of claim 3, wherein the power management system includes a power converter adapted to covert low voltage AC received from the another capacitor into low voltage DC for communication to the power supply.

5. The on-line measurement system of claim 3, wherein the power management system includes a power storage device.

6. The on-line measurement system of claim 1, wherein the measurement platform includes a processor adapted to convert and isolate measurement data from the at least one sensor.

7. The on-line measurement system of claim 1, wherein the at least one sensor includes a configurable front end measurement interface adapted to sense at least one voltage and/or current level of the transmission line.

8. The on-line measurement system of claim 1, wherein the at least one sensor includes at least one of a resistive divider and a current transformer.

9. The on-line measurement system of claim 1, wherein the communications circuitry of the monitoring bank includes wireless communications circuitry for wirelessly communicating parameters of the transmission line to external users.

10. The on-line measurement system of claim 1, wherein the wireless communications circuitry is adapted to provide a wireless access point.

11. The on-line measurement system of claim 1, wherein the energy management system includes capacitive voltage divider protection circuitry through which the one capacitor is in communication with the transmission line.

12. The on-line measurement system of claim 11, wherein the capacitive voltage divider protection circuitry includes at least one of in-rush current limiting protection circuitry and surge arrestor circuitry.

13. The on-line measurement system of claim 11, further comprising an auxiliary power port in communication with the energy management system to provide electrical power to auxiliary devices.

14. A measurement device for measurement and communication of transmission parameters of a transmission line, the system comprising:
a measurement interface mounted on and connected with the transmission line for measurement of one or more transmission parameters, the measurement interface including at least one sensor in communication with the transmission line to sense one or more parameters of the transmission line;
a monitoring bank arranged in communication with the measurement interface to receive indications of the one or more parameters of the transmission line, the monitoring bank including at least one processor and communication circuitry, the at least one processor adapted to execute instructions to communicate indications of the one or more parameters of the transmission line to users via the communication circuitry; and an energy management system connected with the transmission line for collecting and managing energy for operation of the on-line measurement system, the energy management system including a capacitive voltage divider bank having a plurality of serially connected capacitors, one capacitor of the plurality in communication with the transmission line to receive a transmission line voltage and another capacitor connected to output an output voltage lower than the transmission line voltage.

15. The measurement device of claim 14, wherein the measurement interface is connected with the transmission line at a first connection and the energy management system is connected with the transmission line at a second connection.

16. The measurement device of claim 14, further comprising a power management system for regulating electric power to at least one of the measurement interface and the monitoring bank, the power management system including a power supply connected with the at least one of the measurement interface and the monitoring bank.

17. The measurement device of claim 16, wherein the power management system includes a power converter adapted to covert low voltage AC received from the another capacitor into low voltage DC for communication to the power supply.

18. The measurement device of claim 16, wherein the power management system includes a power storage device.

19. The measurement device of claim 14, wherein the measurement interface includes a processor adapted to convert and isolate measurement data from the at least one sensor.

20. The measurement device of claim 14, wherein the at least one sensor includes a configurable front end measurement interface adapted to sense at least one voltage and/or current level of the transmission line.

21. The measurement device of claim 14, wherein the communications circuitry of the monitoring bank includes wireless communications circuitry for wirelessly communicating parameters of the transmission line to users.

* * * * *